United States Patent
Vitale (10) Patent No.: US 10,312,174 B2
(45) Date of Patent: Jun. 4, 2019

(54) THERMAL MANAGEMENT SYSTEM (71) Applicant: Apple Inc., Cupertino, CA (US)

(72) Inventor: Victor M. Vitale, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/429,831

(22) Filed: Feb. 10, 2017

(65) Prior Publication Data

US 2018/0063996 A1    Mar. 1, 2018

Related U.S. Application Data

(60) Provisional application No. 62/380,666, filed on Aug. 29, 2016.

(51) Int. Cl.
| | |
|---|---|
| *G06F 1/20* | (2006.01) |
| *F28F 21/02* | (2006.01) |
| *H01L 23/373* | (2006.01) |
| *H01L 23/36* | (2006.01) |

(52) U.S. Cl.
CPC ............ *H01L 23/373* (2013.01); *F28F 21/02* (2013.01); *G06F 1/203* (2013.01); *H01L 23/3735* (2013.01); *H01L 23/3737* (2013.01)

(58) Field of Classification Search
CPC .............. G06F 1/181–1/182; H05K 7/20218–7/20381; H05K 7/20409–7/20418; H05K 7/20009–7/202; H01L 23/367–23/3677; H01L 23/473; H01L 23/46–23/467; H01L 23/36
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 2006/0234021 | A1* | 10/2006 | Tanei | H01L 21/481 428/210 |
| 2007/0119541 | A1* | 5/2007 | Kawabata | H01L 23/49822 156/307.7 |
| 2007/0139888 | A1* | 6/2007 | Hamman | F28F 9/0282 361/701 |
| 2008/0019097 | A1* | 1/2008 | Zhang | F28F 13/00 361/704 |
| 2008/0213612 | A1* | 9/2008 | Starikov | B23K 1/0008 428/573 |
| 2009/0190312 | A1* | 7/2009 | Katayama | H01L 21/268 361/708 |

(Continued)

*Primary Examiner* — Robert J Hoffberg
*Assistant Examiner* — Razmeen Gafur
(74) *Attorney, Agent, or Firm* — Dickinson Wright RLLP (57) ABSTRACT

A thermal management system is described. The thermal management system being well suited for electronic devices having limited size and operational components that produce excess heat. The thermal management system includes a thermal transport mechanism formed of material having anisotropic thermal conducting properties such that heat is transported from a heat source to a heat sink using a directed heat path. The directed heat path provided by regions having a first thermal conductivity embedded within a substrate characterized as having a second thermal conductivity that is less than the first thermal conductivity.

17 Claims, 4 Drawing Sheets

(56) References Cited

U.S. PATENT DOCUMENTS

| | | | | |
|---|---|---|---|---|
| 2010/0085713 A1* | 4/2010 | Balandin | H01L 23/373 | 361/705 |
| 2010/0110642 A1* | 5/2010 | Pauley | H05K 1/0203 | 361/721 |
| 2010/0246138 A1* | 9/2010 | Shi | H01L 21/50 | 361/717 |
| 2010/0315783 A1* | 12/2010 | Lemak | H01L 23/373 | 361/708 |
| 2010/0321895 A1* | 12/2010 | Hill | H05K 7/20472 | 361/715 |
| 2011/0070459 A1* | 3/2011 | Kim | B23K 1/0012 | 428/615 |
| 2011/0085304 A1* | 4/2011 | Bindrup | H01L 21/4871 | 361/718 |
| 2012/0147913 A1* | 6/2012 | Ushinsky | C30B 29/28 | 372/34 |
| 2012/0306082 A1* | 12/2012 | Sekar | H01L 23/3677 | 257/758 |
| 2013/0170142 A1* | 7/2013 | Weaver, Jr. | H01L 23/427 | 361/701 |
| 2013/0258595 A1* | 10/2013 | Tuckerman | H01L 23/3677 | 361/701 |
| 2013/0258596 A1* | 10/2013 | Sharaf | H05K 7/20927 | 361/702 |
| 2013/0265721 A1* | 10/2013 | Strader | H05K 7/2039 | 361/705 |
| 2013/0265722 A1* | 10/2013 | Hill | G06F 1/203 | 361/707 |
| 2014/0119035 A1* | 5/2014 | Van Bommel | H01L 33/645 | 362/382 |
| 2014/0268572 A1* | 9/2014 | Ranjan | H05K 7/20336 | 361/700 |
| 2014/0268578 A1* | 9/2014 | Dolci | H05K 9/0049 | 361/719 |
| 2014/0293533 A1* | 10/2014 | Doering | G06F 1/20 | 361/679.54 |
| 2014/0355215 A1* | 12/2014 | Canete | H05K 3/30 | 361/720 |
| 2015/0189792 A1* | 7/2015 | Kenna | B23P 15/26 | 361/704 |
| 2015/0362265 A1* | 12/2015 | Broido | H05K 7/20509 | 361/710 |
| 2015/0382444 A1* | 12/2015 | Lin | H01L 23/3677 | 361/709 |
| 2016/0071782 A1* | 3/2016 | Imamura | H01L 24/81 | 257/690 |
| 2016/0358838 A1* | 12/2016 | Basler | H01L 23/49861 | |
| 2017/0317005 A1* | 11/2017 | Standing | H01L 23/367 | |

\* cited by examiner

THERMAL MANAGEMENT SYSTEM

CROSS-REFERENCE TO RELATED APPLICATION

This application claims the benefit of priority under 35 U.S.C. § 119(e) to U.S. Provisional Application No. 62/380,666, filed on Aug. 29, 2016, and titled "THERMAL MANAGEMENT SYSTEM," the disclosure of which is incorporated herein by reference in its entirety.

BACKGROUND

Graphite sheet materials can be used for distributing heat generated at a heat source. A heat spreader formed of sheets of graphite material can take advantage of the anisotropic thermal properties of graphite, In particular, graphite sheet material exhibits a high thermal conductivity in the plane (x,y) of the graphite sheet and a much lower thermal conductivity through the thickness (z) of the graphite sheet. More specifically, the graphite sheet can have a thermal conductivity ranging from about 1200-1500 W/m-K (depending upon the thickness) in a direction that is generally parallel to the layer planes (x,y) and from 3-10 W/m-K perpendicular to the layer planes (z). In this way, the graphite sheet can function as both a heat spreader and an insulator.

SUMMARY

An electronic device having a heat source is described. The electronic device includes a housing that defines an internal volume, the housing carrying the heat source within the internal volume, and a heat transport mechanism carried by the housing within the internal volume and in thermal contact with the heat source. The heat transport mechanism includes a first layer of thermally conductive material. The first layer of thermally conductive material includes a first region having a first thickness and a second region having a second thickness less than the first thickness and that defines an in-plane heat path such that heat flow in the first layer is generally limited to the in-plane heat path. The heat transport mechanism also includes a second layer laterally displaced from the first layer and in thermal contact at least with the second region forming a transverse heat path that allows heat to flow away from the heat source in an out-plane direction generally away from the first layer.

A thermal management system for transporting heat from a heat source includes a first layer of a first heat transport material that provides a first heat transport path that allows heat to flow in a direction that is generally parallel to the first layer, a second layer of a second heat transport material that provides a second heat transport path that allows heat to flow in a direction that is generally parallel to the second layer, and an interfacial layer formed of a thermally insulating adhesive material disposed between the first and second layers, the interfacial layer securing the first and second layers together. The interfacial layer includes a thermal via that allows heat to flow between the first and second layers along a defined path.

A method of manufacturing a thermal management system is carried out by identifying a location of a thermal via at a layer of graphite, the layer of graphite having a preferred thermal path parallel to a plane defined by the layer of graphite, cutting a hole in the layer of graphite at the identified location, the hole having a side and a shape defined by an internal edge, placing a thermal insert formed of silicon carbide (SiC) into the hole, the thermal insert having a preferred thermal path that is perpendicular to a plane defined the thermal insert and that is perpendicular to the plane defined by the layer of graphite, and bonding the thermal insert to the edge, wherein the layer-bonded insert comprises a first thermal path that is limited to being generally perpendicular to the plane defined by the layer and a second heat path that is limited to being generally parallel to the plane defined by the layer.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Sheets of graphite can be used for distributing heat generated by a heat source. A heat spreader formed of graphite sheets can take advantage of the anisotropic thermal properties of graphite, in particular, the graphite sheet exhibits a high thermal conductivity in the plane (x,y) of the graphite sheet and a much lower thermal conductivity through the thickness (z) of the graphite sheet. More specifically, the graphite sheet can have a thermal conductivity ranging from 1200-1500 W/m-K (depending upon the thickness) in a direction that is generally parallel to the layer planes (x,y) of carbon atoms that form the graphite sheet and from 3-10 W/m-K in a direction that is perpendicular to the layer planes (z). In this way, the graphite sheet can function as both a heat spreader and an insulator that can be used to eliminate localized hot spots.

However, in some cases, it may be necessary to enhance thermal conductivity in the z direction of the graphite sheet. For example, a small electronic device having a compact design can rely upon electronic components (such as a processor) that generate heat during operation that due to the small size and close quarters, can be problematic with regards to the optimal operation of nearby heat sensitive electronic components and the processor itself. Relying on a heat spreader formed of conventionally arranged graphite sheets that provides a high capacity heat path only in the plane of the graphite sheets can result in hot spots at those portions of the device housing used as heat sinks. Moreover, a minimum thermal mass is generally required to remove a certain amount of heat required for optimal device performance. Removal of this amount of heat may require a thermal mass requiring a substantial number of graphite sheets bonded together (as opposed to a single thick graphite sheet which as discussed below has a thermal conductivity that is inversely related to graphite sheet thickness). Therefore, in order to create a stable structure, the graphite sheets can be secured together by an interfacial layer formed of an adhesive. Since the adhesive is generally not a good thermal conductor, the interfacial layer represents a sizeable thermal resistance (in addition to the inherent thermal resistance in the z direction), and the amount of heat transported by adjacent graphite sheets is reduced as the distance from the heat source and the number of interfacial layers increases.

Although sheets formed of graphite (both natural and synthetic) for a heat spreader can be well suited for use in a small form factor electronic device, additional heat paths must be made available in high component density systems. For example, taking advantage of the increased thermal conductivity as graphite sheet thickness decreases, reducing the thickness of the graphite sheets can result an increase in thermal conductivity thereby facilitating a higher capacity heat path. Accordingly, in some embodiments, a single graphite sheet can have regions of varying thermal conductivity representing a preferred heat path. For example, a region having a reduced thickness can have an increased thermal conductivity and act as an internal heat path compared to an adjacent region having a greater thickness. Moreover, regions of defined reduced thickness can provide a well defined thermal path for transport of heat as opposed to the more general diffusion type dispersion of heat typical of the graphite sheet having a uniform thickness, In this way, internal heat paths can be created in a single graphite sheet having the ability to direct heat along the preferred path (represented by the reduced thickness higher thermally conductive path).

Moreover, in addition to providing specific heat paths in the planar direction, the this paper describes a heat spreader that can conduct heat away from a heat source in three dimensions. More specifically, the heat spreader can include both a planar heat path that allows heat to flow in a directed manner in the (x,y) plane but also a transverse heat path that allows heat to flow in a directed manner in the (z) direction.

Generally speaking, the heat spreader can be formed of at least a graphite sheet(s). The graphite sheets can have a uniform thickness that promotes heat transfer in a plane defined by the carbon atoms that form the graphite sheet. The graphite sheet can also have regions of varying thickness that represent regions of different thermal conductivity. For example, one region of the graphite sheet can have a reduced thickness as compared to another region. In this case, the region of reduced graphite thickness has an increased thermal conductivity as compared to the region having the relatively greater thickness. The transverse heat path can be directed generally in the (z) direction at an angle with respect to the graphite sheet. In one embodiment, the transverse heat path can include a thermal insert formed of a material having both an anisotropic heat transfer property as wells as good chemical bonding with the graphite sheet.

In one embodiment, the thermal insert can take the form of graphite having a reduced thickness. In one embodiment, the insert can be formed of a material having a good bonding affinity with graphite was well as good thermal transfer characteristics. For example, the insert can be an organic compound (i.e., includes carbon (C)) that affords good compatibility with carbon atoms that form the graphite sheet. For example, the insert can be formed of silicon carbide (SiC) or materials having similar thermal properties and a similar affinity for bonding with carbon that forms the graphite. The thermal insert can be bonded to the graphite sheet such that the graphite sheet portion provides a good in-plane (x,y) thermal path whereas the thermal insert can provide a good out of plan (z) thermal path. Moreover, in a stacked arrangement, the thermal inserts can provide a highly conductive thermal path that is well defined in the z direction. This highly conductive thermal path in the z direction can be linear, serpentine, or a stepwise arrangement depending a location of heat sinks or nearby thermally sensitive components. The additional heat transport path can be used to direct at least some of the heat generated by heat source to specific locations that are out-of-plane with regards to the graphite layers. The directionality of the out-of-plane heat path provides for additional potential heat sinks heretofore unavailable with thermal management systems that rely solely upon the in-plane thermal heat path.

Therefore, a thermal management system well suited for use in small form factor electronic devices is presented. The thermal management system can be passive in nature by which it is meant that heat transport is conducted without the use of active components such as a fan or fan assembly. In any case, the thermal management system described herein can take the form of a heat spreader that includes both an in-plane heat transport path arranged to transport heat from a heat source along a plane defined by a planar arrangement of heat transport media and an out-of-plane heat transport path generally perpendicular to the in-plane heat path. The heat spreader can use materials having anisotropic thermal properties such natural or synthetic graphite formed in a layer that defines the in-plane heat transport mechanism.

The out-of-plane heat transport mechanism is generally independent of the in-plane heat transport mechanism. The out-of-plane heat transport mechanism can provide a thermal path that can have any angular relationship to the in-plane heat transport. For the remainder is this discussion and without loss of generality, the out-of-plane heat transport is considered to be generally perpendicular to the plane defined by the graphite layer. The out-of-plane heat transport mechanism can be formed of inserts that can fit within an opening formed in the planar arrangement of heat transport media.

In order to assure an optimal bonding (both mechanically and thermally) between the graphite and the insert, the insert can include carbon. One such material well suited for use as the insert is silicon carbide (SiC) having thermal characteristics that provide a preferred heat path perpendicular to the graphite layer. In this way, the insert can be chemically bonded to the graphite layer in such a way that there is essentially no heat transport across a junction formed between the insert as most of the heat is transported in a direction perpendicular to the graphite layer. In the way, the graphite layer and the insert can provide corresponding heat paths that are essentially orthogonal to each other.

Figure 1:
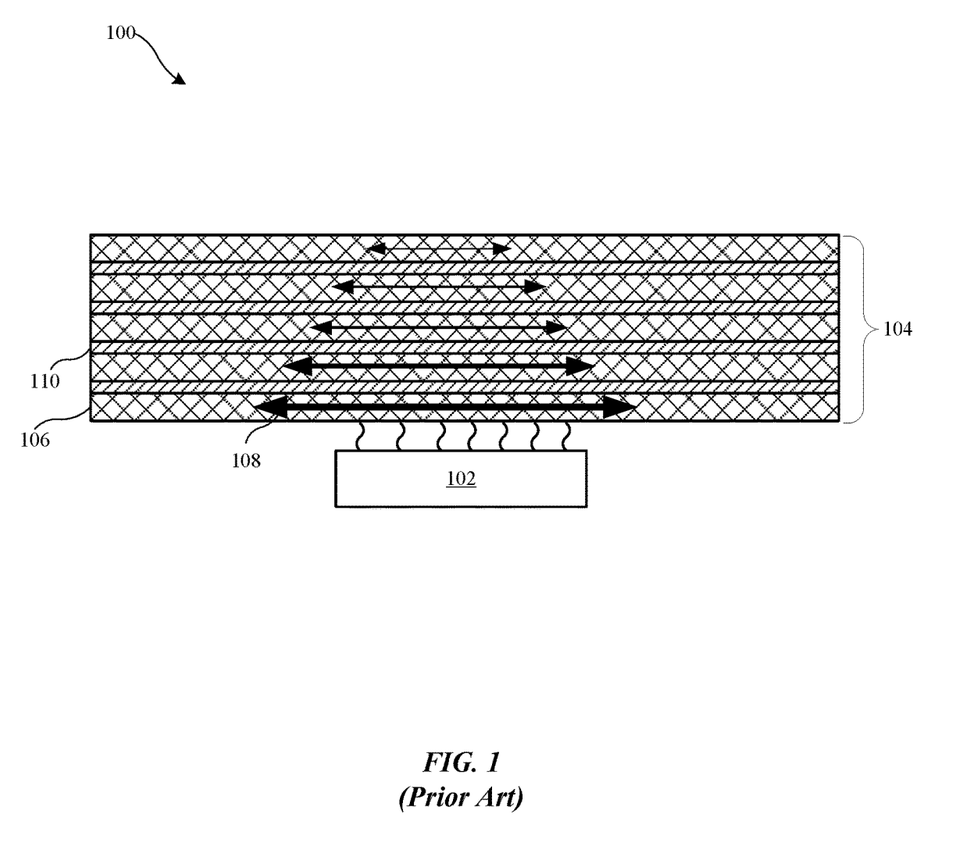
FIG. 1 shows a conventional thermal management system.

FIG. 1 shows a conventional thermal management system in the form of heat spreader 100. Heat spreader 100 relies primarily upon a planar heat transport mechanism to transport heat away from heat source 102. In this case, the planar heat transport mechanism includes a stack 104 of thermally conductive layers 106 having anisotropic heat transfer characteristics by which it is meant that heat conduction is strongly favored in one direction as compared to another. In the case where thermally conductive layers 106 are formed of graphite, a preferred heat path is one that is generally aligned with the planar structure of the carbon atoms that form the graphite. Accordingly, most of the heat from heat source 102 flows in an in-plane direction (as denoted by the various heat paths 108) along a path defined by the thermally conductive layer with little or no heat transport out of the plane. In this case, the thermally conductive layers 106 secured to each other by adhesive in the form of interfacial layer 110.

Generally speaking, the adhesive can act as a thermal resistor that in combination with the inherent low thermal conductivity in the z direction effectively thermally separates adjacent thermally conductive layers 106 from each other. By thermally separated it is meant that although there is at least some heat transfer from individual thermally conductive layers 104 and across interfacial layer 108, the amount of heat transferred is substantially less than that transferred in-plane. As a result, since the overall thermal resistance increases the further away from heat source 102 (and the number of interfacial layers increases), the overall amount of heat being transported by the thermally conductive layers is reduced the further removed from heat source 102. It should also be noted that any heat transfer that occurs between thermally conductive layers is generally undirected by which it is meant that heat flows in an essentially uncontrolled manner and in an uncontrolled direction with no particular control of where the heat path is able to couple with a heat sink. Accordingly, heat sinks must be located at those locations that are determined by properties of thermally conductive layer 104. For example, as shown in FIG. 1, in order to remove as much as the heat as possible, heat sinks would have to be in thermal contact with most if not all of the thermally conductive layers. It should be noted that as noted below, the thickness of each of thermally conductive layer 106 could have an effect on the ability of thermally conductive layer 106 to transport heat. This effect is shown graphically by in FIG. 1 where each successive heat path having a reduced heat transfer load is shown by a line having a lesser weight.

Figure 2A:
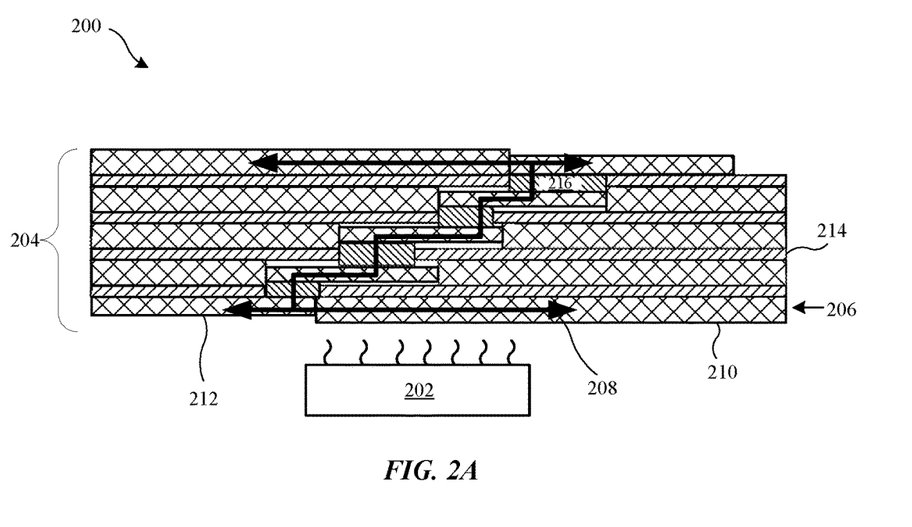
FIG. 2A shows a cross sectional view of a thermal management system in accordance with the described embodiments.
Figure 2B:
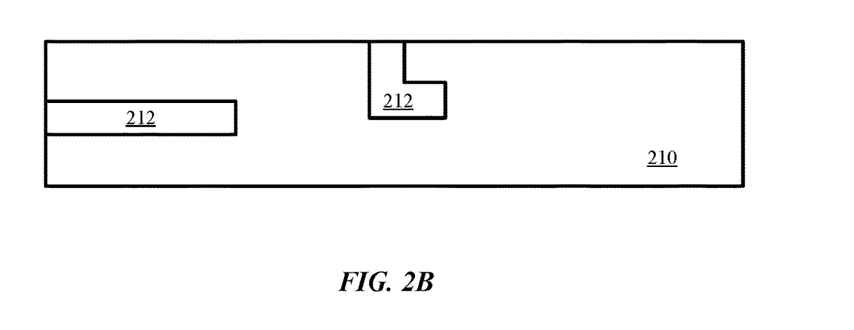
FIG. 2B shows a top down view of a heat transport layer that includes regions of reduced thickness representative of a directed heat path in accordance with the described embodiments.

FIG. 2A shows a thermal management system in the form of heat spreader 200 in accordance with the described embodiments. Heat spreader 200 is capable of transporting heat from heat source 202 using both planar heat conduction and transverse heat conduction. More specifically, heat spreader 202 can include stack 204 of heat transport layers 206. Heat transport layer 206 can define heat path 208 having a planar component that is capable of transporting heat away from heat source 202 in a manner that is generally parallel to the (x,y) plane (shown as a planar path). Heat path 208 can also have a transverse component that is capable of transporting heat away from heat source 202 in a manner that is generally transverse (i.e., away) from heat source 202 (shown as a step-wise path). In the described embodiment, heat transport layer 206 can be formed of graphite (either or both natural and synthetic). In order to improve overall heat transfer as well as providing a directionality to the heat transfer, heat transport layer 206 can include portions of varying thickness that provide regions of differing thermal conductivity since thermal conductivity can vary inversely as the thickness of the sheet of graphite (described below). For example, heat transfer layer 206 can include first portion 210 having corresponding thickness $t_1$ and can also include second portion 212 having corresponding thickness $t_2$. In the described embodiment thickness $t_1$ can be greater than $t_2$ (or vice versa). In a particular implementation, thickness $t_1$ can be about 40 microns (representing thermal conductivity of about 1200 W/m-K) whereas thickness $t_2$ can be about 17 microns (representing thermal conductivity of about 1500 W/m-K) whereas interfacial layer 214 can have a thermal conductivity of about 5.0 W/m-K. In this way, second portion 212 can provide a preferred heat path (as shown in FIG. 2B) as compared to first portion 210. It should be noted that although heat is transported via conventional thermal diffusion in both first portion 210 and second portion 212, since the thermal conductivity of second portion 212 is greater than that of first portion 210, the greater propensity of second portion 212 to allow heat to flow can be representative of a preferred heat path (as illustrated in FIG. 2B).

Generally speaking, interfacial layer 214 can be located between heat transport layers and include adhesive material that can be used to secure the heat transport layers in the form of stack 204. In the embodiment shown, interfacial layer 214 can include thermal insert 216 having a substantially higher thermal conductivity then that of interfacial layer 214. For example, thermal insert 216 can be formed of a material, such as SiC, having a thermal conductivity of about 360 W/m-K that although not as high as graphite found in thermally conductive layer 206 is nonetheless substantially higher than that of surrounding interfacial layer 214. Thermal insert 216 can optionally be in thermal contact with second region 212. In this way, thermal insert 216 can help provide a structure that promotes heat flow along the transverse component of heat path 208. It should also be noted that in addition to its propitious thermal characteristics, SiC has a good affinity to bond with carbon (graphite). In this way, thermal insert 216 (in the form of SiC) when positioned within and as part of interfacial layer 214 can facilitate bonding together of adjacent thermally conductive layers 206 thereby improving both the overall structural integrity and heat transfer properties of heat spreader 200.

Figure 3:
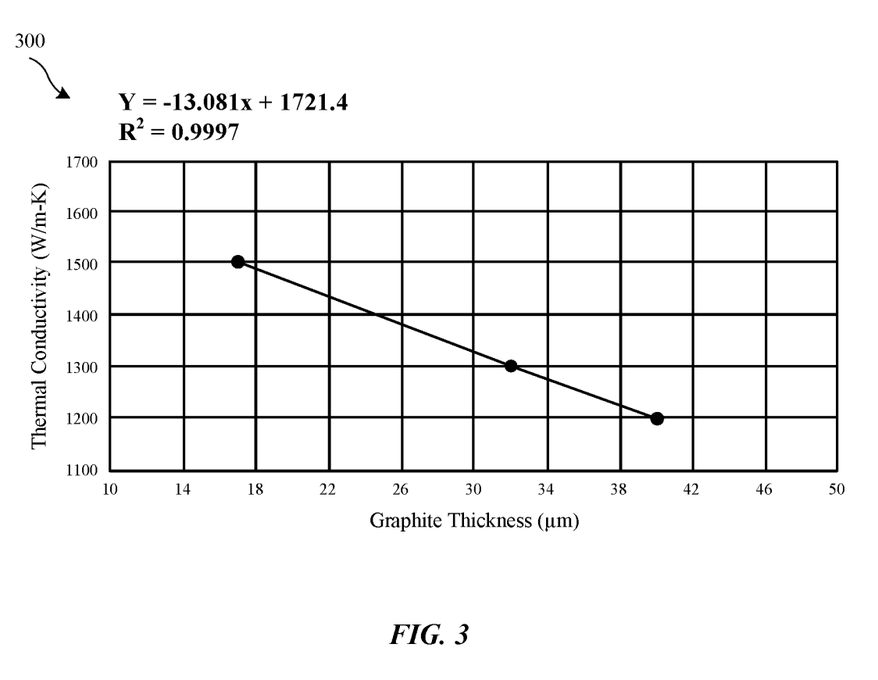
FIG. 3 illustrates a representative graph showing relationship between graphite layer thickness (in microns) and thermal conductivity (W/m-K)

FIG. 3 illustrates representative graph 300 showing relationship between graphite layer thickness (in microns) and thermal conductivity (W/m-K). As seen, thermal conductivity varies inversely and in a linear fashion (percentage of the response variable variation that is explained by a linear mode, or $R^2$, of about 0.9997) to the thickness of the graphite layer. For example, at 17 microns, the thermal conductivity is about 1500 W/m-K whereas at 40 microns the thermal conductivity is about 1200 W/m-K.

Figure 4:
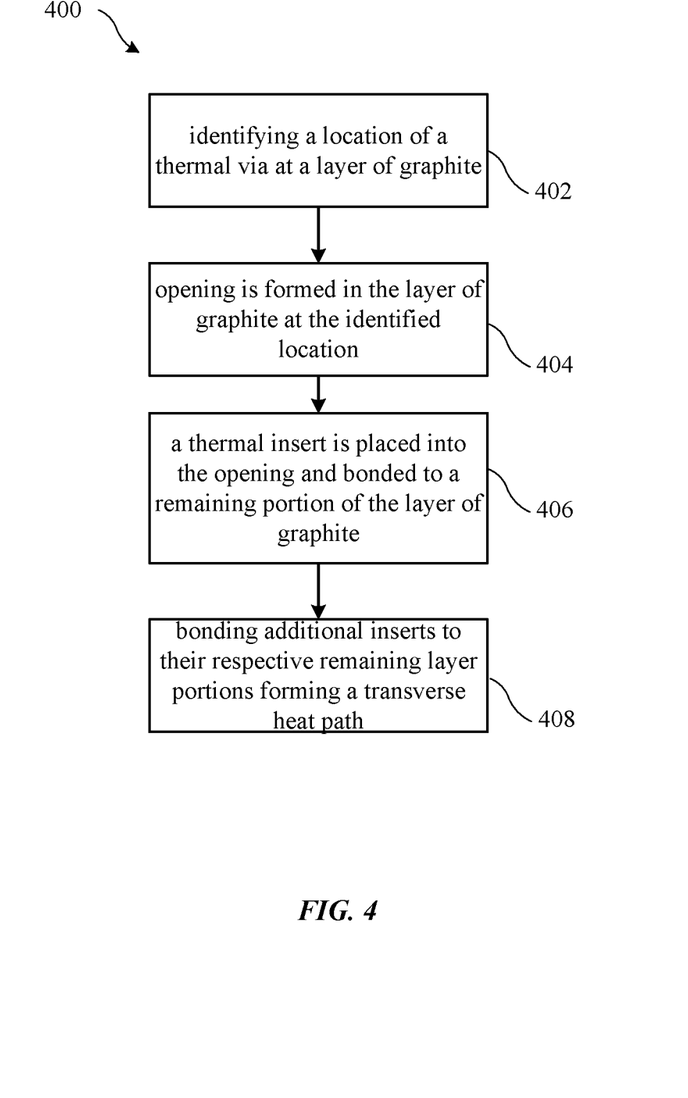
FIG. 4 is a flowchart detailing operations describing a method of manufacturing a thermal management system in accordance with the described embodiments.

FIG. 4 is a flowchart detail operations describing method 400 of manufacturing a thermal management system in accordance with the described embodiments. Method 400 can be carried out by identifying at 402 a location of a thermal via at a layer of graphite, the layer of graphite providing a preferred thermal path in a plane defined by the layer of graphite. At 404, an opening is formed in the layer of graphite at the identified location and having a side and a shape defined by an internal edge. At 406, a thermal insert is placed into the opening and bonded to a remaining portion of the layer of graphite. It should be noted that in addition to this operation can be carried out with regards to an interfacial layer where the thermal insert can be placed at a location that thermally couples the interfacial layer thermal insert with the graphite layer thermal insert carried by an adjacent graphite layer(s). In this way, the thermally coupled thermal inserts cooperate to define a preferred thermal path that is perpendicular to a plane defined the thermal insert and that is perpendicular to the plane defined by the layer of graphite. At 408, the thermal inserts are bonded to their respective remaining layers. In this way, the inventive heat spreader can provide a heat path has a planar component is generally parallel to the graphite layer (x,y) and a transverse component (z) that is generally perpendicular to the graphite layer. In some cases, the transverse component can define a stepwise heat path, a serpentine heat path, or a vertical heat path whichever is the most direct path to a desired heat sink(s).

The various aspects, embodiments, implementations or features of the described embodiments can be used separately or in any combination. Software, hardware or a combination of hardware and software can implement various aspects of the described embodiments. The described embodiments can also be embodied as computer readable code on a computer readable medium for controlling manufacturing operations or as computer readable code on a computer readable medium for controlling a manufacturing line. The computer readable medium is any data storage device that can store data, which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic device having a heat source, the electronic device comprising:
   a housing that defines an internal volume, the housing carrying the heat source within the internal volume; and
   a heat transport mechanism carried by the housing within the internal volume and in thermal contact with the heat source, the heat transport mechanism comprising:
      a first layer of graphite comprising a first region in thermal contact with the heat source and having a first thickness and a second region having a second thickness less than the first thickness, wherein the first layer of graphite forms a parallel heat path that allows heat to flow from the first region to the second region in a direction generally parallel with a plane of the first layer of graphite,
      a second layer of graphite displaced from the first layer in a transverse direction generally perpendicular to the plane of the first layer, the second layer of graphite separated from the first layer of graphite by an interfacial layer disposed between the first layer of graphite and the second layer of graphite, and
      a thermal insert located in an opening in the interfacial layer and in thermal contact at least with the second region of the first layer of graphite forming a transverse heat path that allows heat to flow away from the heat source in the transverse direction generally away from the first layer of graphite,
      wherein the second region provides a preferred heat path to conduct heat from the heat source to the second layer.

2. The electronic device as recited in claim 1, wherein the first region has a first thermal conductivity and the second region has a second thermal conductivity that is greater than the first thermal conductivity, and wherein the preferred heat path comprises:
   a first heat transport path generally parallel to the plane of the first layer of graphite from the first region to the second region; and
   a second heat transport path from the second region through the thermal insert to the second layer in the transverse direction.

3. The electronic device as recited in claim 1, the first layer of graphite further comprising an internal edge that defines the opening having a size and shape suitable for accommodating the thermal insert.

4. The electronic device as recited in claim 3, the thermal insert bonded to the internal edge, the thermal insert comprising thermally conductive material having a thermal conductivity that is different than a thermal conductivity of the first and the second regions.

5. The electronic device as recited in claim 1, wherein the thermal insert comprises silicon carbide (SiC).

6. A thermal management system for transporting heat from a heat source, comprising:
   a first layer of graphite that provides a first heat transport path, the first heat transfer path allowing heat to flow in a direction that is generally parallel to a plane of the first layer, wherein the first layer includes a first region and a second region having a higher thermal conductivity than the first region;
   a thermal insert in contact with the second region and providing a second heat transport path allowing heat to flow in a direction that is generally perpendicular to the plane of the first layer;
   a second layer of graphite that provides a third heat transport path, the third heat transport path allowing heat to flow in a direction that is generally parallel to a plane of the second layer;
   an interfacial layer formed of a thermally insulating adhesive material disposed between the first layer and the second layer, the adhesive material securing the first layer to the second layer, the interfacial layer comprising a thermal via that accommodates the thermal insert and allows heat to flow between the first layer and the second layer along a defined heat path.

7. The thermal management system as recited in claim 6, wherein the first layer is in direct thermal contact with the heat source.

8. The thermal management system as recited in claim 6, wherein the thermal insert is formed of a heat transport material that is bonded to the interfacial layer within an opening defined by the thermal via.

9. The thermal management system as recited in claim 8, wherein the heat transport material is silicon carbide (SiC).

10. The thermal management system as recited in claim 6, wherein the first region has a first thickness and the second region has a second thickness less than the first thickness.

11. The thermal management system as recited in claim 6, wherein the defined heat path between the first layer and the second layer is a serpentine arrangement.

12. The thermal management system as recited in claim 6, wherein the defined heat path between the first layer and the second layer is a staircase arrangement.

13. The thermal management system as recited in claim 6, wherein the defined heat path is a vertical stack arrangement.

14. A method of manufacturing a thermal management system, the method comprising:
   identifying a location of a thermal via at a layer of graphite, the layer of graphite having a preferred thermal path parallel to a plane defined by the layer of graphite;
   placing a thermal insert formed of silicon carbide (SiC) at the location of the thermal via, the thermal insert providing a preferred thermal path that is perpendicular to the plane defined by the layer of graphite; and
   bonding the thermal insert between the layer of graphite and an additional layer of graphite using an adhesive that forms an interfacial layer between the layer of graphite and the additional layer of graphite,
   wherein the layer of graphite includes a first region having a first thickness and a second region having a second thickness that is less than the first thickness, and wherein the location of the thermal via corresponds with the second region.

15. The method as recited in claim 14, wherein the layer of graphite comprises a thickness that ranges from about 10 microns to about 50 microns.

16. The method as recited in claim 14, wherein a thermal conductivity of the layer of graphite in a transverse direction ranges from about 1500 W/m-K in the second region to about 1000 W/m-K in the first region.

17. The method as recited in claim 14, wherein the graphite is natural graphite.

* * * * *